United States Patent [19]

Gardner

[11] Patent Number: 5,592,958

[45] Date of Patent: Jan. 14, 1997

[54] FLOOD CONVEYER

[75] Inventor: Kenneth D. Gardner, Apache Junction, Ariz.

[73] Assignee: Coates, Asi, Inc., Phoenix, Ariz.

[21] Appl. No.: 382,077

[22] Filed: Feb. 1, 1995

[51] Int. Cl.[6] ............................................. B08B 3/04
[52] U.S. Cl. ........................ 134/122 R; 118/405; 134/902
[58] Field of Search ................................. 134/64 R, 64 P, 134/122 R, 122 P, 902; 68/22 B, 43, 158, 175; 118/405, 407, 414, 419, 424, 429

[56] References Cited

U.S. PATENT DOCUMENTS

| | | | |
|---|---|---|---|
| 2,918,069 | 12/1959 | Brown, Jr. et al. | 134/122 R X |
| 4,023,190 | 5/1977 | Fassler | 134/64 P X |
| 4,198,994 | 4/1980 | Germain | 134/122 R |
| 4,475,259 | 10/1984 | Ishii et al. | 134/64 R X |
| 4,607,590 | 8/1986 | Pender | 134/64 R X |
| 4,724,856 | 2/1988 | Pender | 134/122 R |
| 5,007,445 | 4/1991 | Pender | 134/122 R |
| 5,248,372 | 9/1993 | McNamee | 134/122 R X |

*Primary Examiner*—Philip R. Coe
*Attorney, Agent, or Firm*—Tod R. Nissle, Esq.

[57] ABSTRACT

Apparatus for processing a thin circuit board substrate includes upper and lower input roller assemblies and upper and lower output roller assemblies. A liquid reservoir extends between the input roller assemblies and the output roller assemblies. The thin substrate travels from the input roller assemblies, through the reservoir, and exits the reservoir via the output roller assemblies. The lower input roller assembly includes alternating rollers of different diameter which permit the interleaving of disks with the lower input roller assembly.

5 Claims, 3 Drawing Sheets

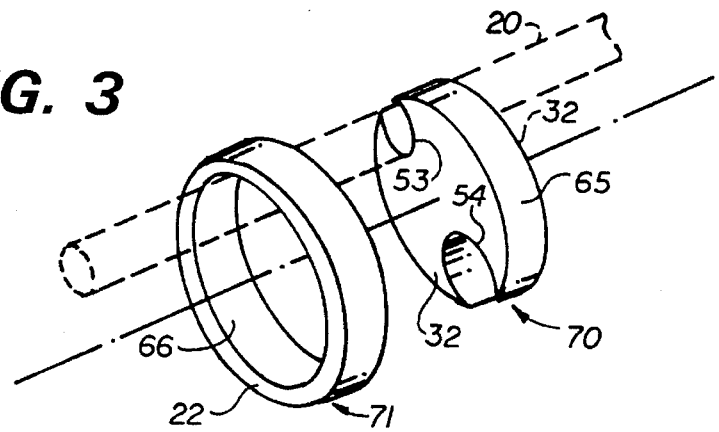
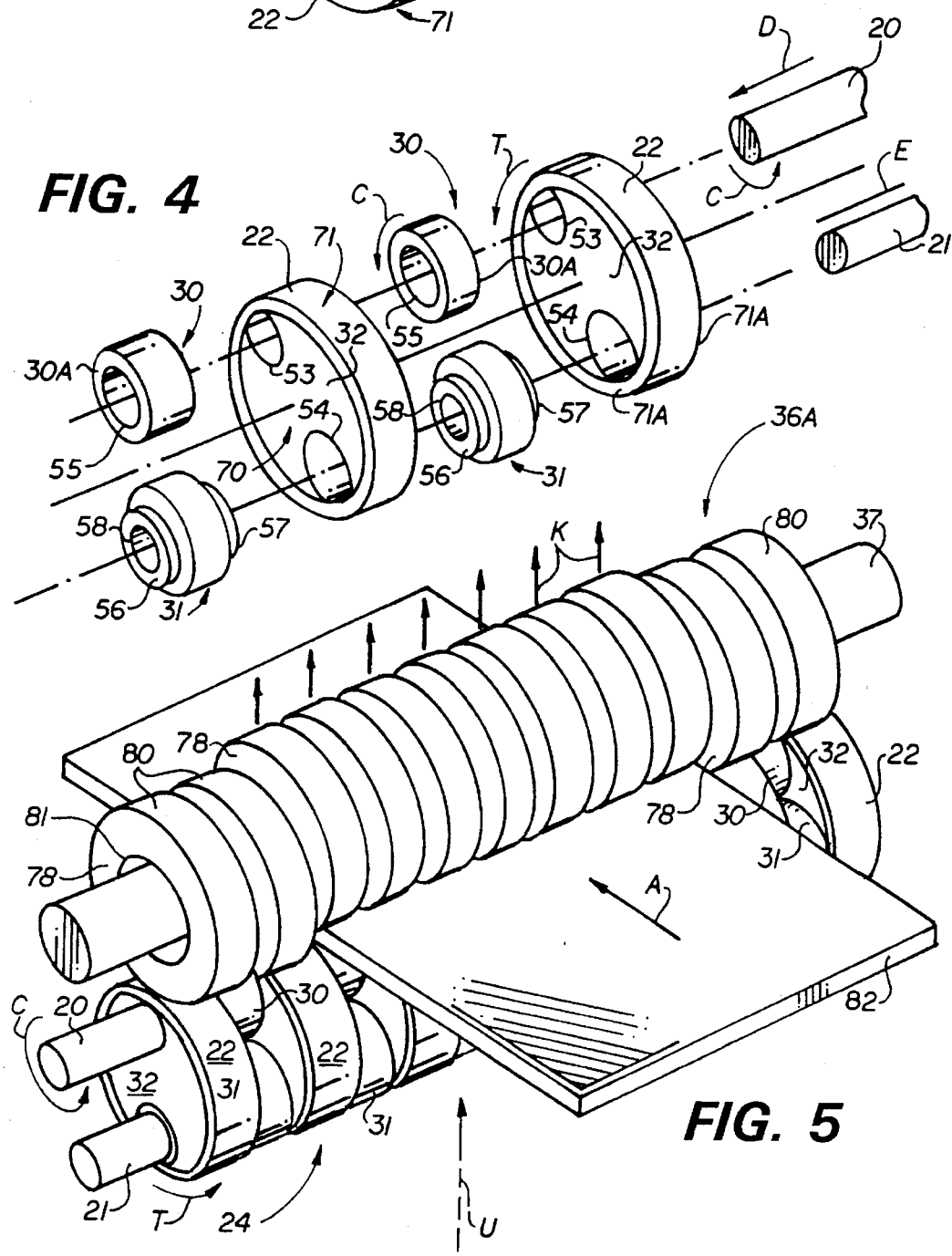

FLOOD CONVEYER

This invention relates to apparatus for processing circuit boards, circuit board substrates, and other thin pieces of material.

More particularly, the apparatus relates to apparatus for transporting small, thin pieces of circuit board substrate or other material through a reservoir of chemicals or some other liquid.

Apparatus for transporting circuit board substrates and other pieces of material through liquid reservoirs is well known in the art. See, for example, U.S. Pat. No. 4,724,856 to Pender. The Pender patent describes a flood conveyor apparatus which functions to reduce the quantity of liquid lost from a reservoir during the transport of a circuit board substrate through the reservoir. The apparatus in the Pender patent also utilizes small intermediate rollers to permit small, thin pieces of circuit board substrate or other material to travel through a liquid reservoir. The smaller intermediate rollers ride on disks in the low areas between adjacent rows of disks. The use, however, of the small intermediate rollers increases the cost of production and maintenance of the fluid conveyor. Further, the fluid conveyor disclosed in the Pender reference permits about three to four gallons of fluid per minute to escape from the fluid reservoir out of the input and output ends of the conveyor. The pumping system used to capture and pump the escaped fluid back into the fluid reservoir increases the cost of manufacture and maintenance of the conveyor.

Accordingly, it would be highly desirable to eliminate the necessity of using smaller intermediate rollers to reduce the cost of constructing the flood conveyor apparatus and to reduce the expense of maintenancing the apparatus. It would also be highly desirable to reduce the quantity of liquid which escapes from the liquid reservoir so that the pumping equipment required to recycle the escaped fluid can be downsized.

Therefore, it is a principal object of the invention to provide improved apparatus for processing a circuit board substrate or other piece of material.

A further object of the invention is to provide an improved flood conveyor for transporting a thin, small piece of circuit board substrate through a chemical bath.

Another object of the invention is to provide an improved flood conveyor of the type described which reduces the quantity of liquid escaping from a chemical bath during transport of a circuit board substrate through the chemical bath.

These and other, further and more specific objects and advantages of the invention will be apparent to those skilled in the art from the following detailed description thereof, taken in conjunction with the drawings, in which:

FIG. 3 is an exploded view illustrating a cylindrical mounting member and of a cylindrical sleeve utilized in the flood conveyor of FIGS. 1 and 2;

FIG. 4 is an exploded view illustrating components of the lower input roller assembly and of the lower output roller assembly utilized in the flood conveyor of FIGS. 1 and 2;

FIG. 5 is a perspective view illustrating the mode of operation of the flood conveyor of the invention;

Briefly, in accordance with the invention, I provide improved apparatus for processing a circuit board substrate by passing the substrate through a reservoir. The apparatus includes an upper input roller assembly; a lower input roller assembly positioned below the upper input roller assembly; an upper output roller assembly spaced apart from the upper input roller assembly and the lower input roller assembly; a lower output roller assembly positioned below the upper output roller assembly and spaced apart from the upper input roller assembly and the lower input roller assembly; a liquid reservoir intermediate and extending above the lower input roller assembly and the lower output roller assembly, the substrate passing intermediate the upper and lower input roller assemblies to enter the reservoir and passing intermediate the upper and lower output roller assemblies to exit the reservoir; and, an intermediate roller assembly adjacent the lower input roller assembly and including a plurality of spaced apart disks for contacting and supporting the substrate passing through the liquid reservoir from the lower input roller assembly to the lower output roller assembly. The lower input roller means includes a plurality of spaced apart cylindrical members for contacting the substrate passing intermediate the upper and lower input roller assemblies; and, a plurality of cylindrical rollers each mounted intermediate a pair of said cylindrical members such that at least a portion of one of said disks extends intermediate the pair of cylindrical members to facilitate the travel of the substrate from the cylindrical members onto the disk.

Figure 1:
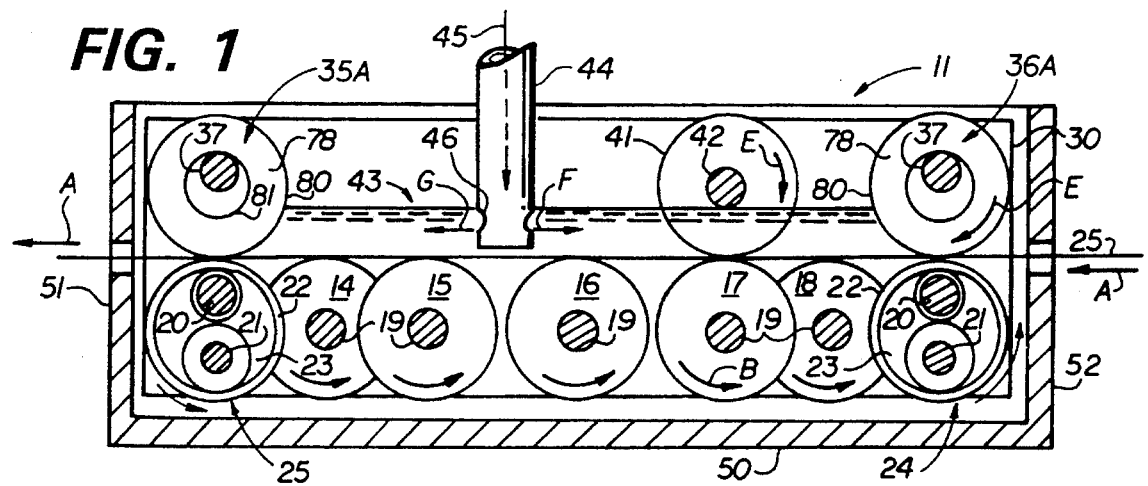
FIG. 1 is a side partial section view illustrating a flood conveyor constructed in accordance with the principles of the invention.
Figure 2:
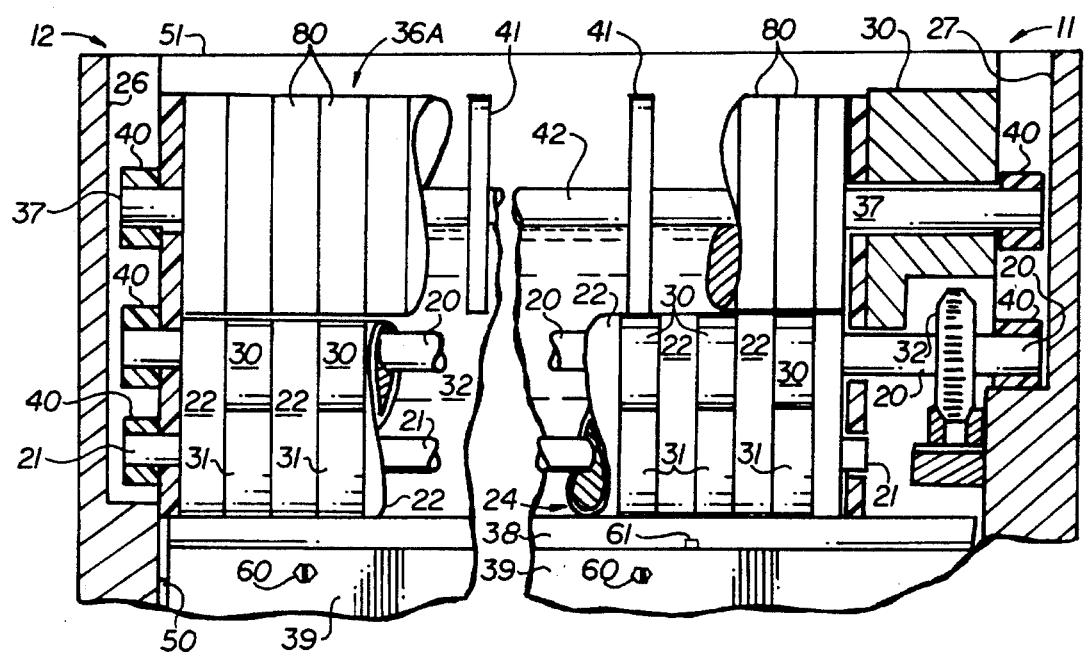
FIG. 2 is a front partial section view illustrating further construction details of the flood conveyor of FIG. 1.

Turning now to the drawings, which illustrate the invention for the purpose of illustrating the practice thereof and not by way of limitation of the scope of the invention and in which like reference characters refer to corresponding elements throughout the several views, FIGS. 1 and 2 illustrate a flood conveyor including a bottom 50, back wall 11, and side walls 51 and 52. Front wall 12 is not visible in FIG. 1 but is visible in FIG. 2. Upper input roller assembly 36A, lower input roller assembly 24, upper output roller assembly 35A, and lower output roller assembly 25 are mounted for rotation in the front 12 and back wall 11. Reservoir 43 extends between the upper and lower input roller assemblies 36A, 24 and the upper and lower output roller assemblies 35A and 25.

The upper roller input assembly 36A is identical to the upper roller output assembly 35A and includes a plurality of cylindrical disks mounted on horizontally oriented shaft 37. Each disk includes an outer cylindrical surface 80 concentric with a central circular opening 81 formed through the disk. The diameter of opening 81 is greater than the diameter of shaft 37. The ends of shaft 37 are received by cylindrical bushings 40 which can slide vertically in vertical slots 26 and 27 formed in walls 12 and 11, respectively. The lower roller input assembly 24 is identical to the lower output assembly 25 and includes components which are illustrated in FIGS. 3 to 5 and will be described in more detail below.

A plurality of disk-bearing roller assemblies are positioned intermediate the lower input and output roller assemblies. One disk-bearing roller assembly includes one or more disks or rollers 41 carried on horizontally oriented shaft 42. When a plurality of disks 41 are carried on shaft 42, the disks ordinarily are, but need not be, spaced apart. Another disk-bearing roller assembly includes one or more disks or rollers 18 carried on a horizontally oriented shaft 19. When a plurality of disks 18 are carried on a shaft 19, the disks ordinarily are spaced apart. A further disk-bearing roller assembly includes one or more disks or rollers 17 carried on a horizontally orient shaft 19; still a further disk-bearing roller assembly includes one or more disks or rollers 16 carried on a horizontally oriented shaft 19; yet still a further disk-bearing roller assembly includes one or more disks or rollers 15 carried on a horizontally oriented shaft 19; and, yet still another disk-bearing roller assembly includes one or more disks or rollers 14 carried on a horizontally oriented shaft 19. Each disk or roller 14 to 18, 41 is ordinarily, but not be, fixedly attached to a shaft 19, 42 so that the disk or roller rotates simultaneously with the shaft 19, 42. Shafts 19, 42 can be mechanically driven to rotate in the direction of arrows B or E or can be caused to freely rotate by frictional torque forces generates when substrate 25 travels overs and contacts disks 14 to 18, 42 while substrate 25 moves in the direction of arrow A. The ends of each shaft 19, 42 presently is received by a bushing like bushing 40 which is contained in and can slide up and down in slots like slots 26, 27 which are formed in walls 11 and 12. Shafts 19 are presently preferably mechanically rotated by a gear assembly which transmits motive power to one end of each shaft 19.

Fluid is injected into nozzle 44 in the direction of arrow 45 and then into reservoir 43 through openings 46 of one or more nozzles 44 in the directions indicated by arrows G and F.

The lower roller input assembly 24 includes cylindrical mounting members 70 having an outer cylindrical surface 65, planar side surfaces or faces 32, and cylindrically shaped apertures 53 and 54 formed therethrough. See FIG. 3. Hollow cylindrical sleeves 71 each include an outer cylindrical contact surface 22 and an inner cylindrical contact surface 66. Each sleeve 71 is mounted on a member 70 such that surface 66 contacts and can slide over surface 65 in the direction of arrow T (FIGS. 4 and 5). Mounting members 70 are stationary. Horizontally oriented rotating shaft 20 extends through apertures 53 and through aperture 55 in rollers 30 in the manner illustrated in FIGS. 3, 4 and 5 and in the direction indicated by arrow D in FIG. 4. The diameter of shaft 20 substantially equals the diameter of apertures 53 and 55 such that shaft 20 can rotate in apertures 53 and 55. Shaft 20 is rotated in the direction of arrow C by turning gear 32A (FIG. 2) fixedly attached to one end of shaft 20. Gear 32A can be manually driven or, as is presently preferred, can be mechanically driven. When shaft 20 rotates, it causes rollers 30 and sleeves 71 to rotate in the directions indicated by arrows C and T in FIG. 4. Rollers 30 are preferably fixedly secured to shaft 20, but can simply slide onto shaft 20 such that when shaft rotates it frictionally engages the cylindrical surface of each aperture 55 and causes each roller 30 to rotate. When rollers 30 are fixedly secured to shaft 20, rollers 30 rotate simultaneously with and at the same RPM as shaft 20. Since each sleeve 71 is slidably mounted on a member 70, the outer cylindrical surface of rotating shaft 20 continuously frictionally engages a portion of the inner cylindrical surface 66 of each sleeve 71 to cause the sleeve 71 to slide over surface 65 and rotate around member 70. Further, when rollers 30 rotate in the direction of arrow C, the side surfaces 30A of rollers 30 can frictionally engage the side surfaces 71A of adjacent sleeves 71 to promote the rotation of sleeves 71 in the direction of arrow T.

Shaft 21 extends through apertures 54 in members 70 and through apertures 58 in spacers 31 in the direction indicated by arrow E in FIG. 4. Each spacer 31 can free wheel about shaft 21 and includes cylindrical outwardly projecting flanges 56 and 57 sized to slide one-half way into and through an aperture 54. The diameter of shaft 21 substantially equals the diameter of apertures 58 and is less than the diameter of apertures 54. Shaft 21 presently does not rotate but can, if desired, be rotated to turn spacers 31 to promote the rotation of rollers 30 in the direction or arrow C. Spacers 31 each presently contact a roller 30 so that the outer cylindrical surface of a turning roller 30 frictionally contacts and tends to turn the outer cylindrical surface of an adjacent spacer 31. When spacers 31 do not turn, each roller 30 can rotate or turn in the direction of arrow C by simply sliding over the portion of the outer cylindrical surface of spacer 31 which contacts the outer cylindrical surface of the roller 30. While each spacer 31 could be fixedly secured to shaft 21 and not rotate, it is presently preferred that each spacer 31 contact a roller 30 in the manner illustrated in FIGS. 2 and 5, and it is presently preferred that spacers 31 rotate. Contact between each roller 30-spacer 31 pair is desired because it minimizes the amount of liquid escaping from reservoir 43 between rollers 30 and spacers 31. The rotation and/or free wheeling of spacers 31 is desired because when spacers 31 rotate about shaft 20 they produce less of a drag on the rotation of rollers 30.

Figure 6:
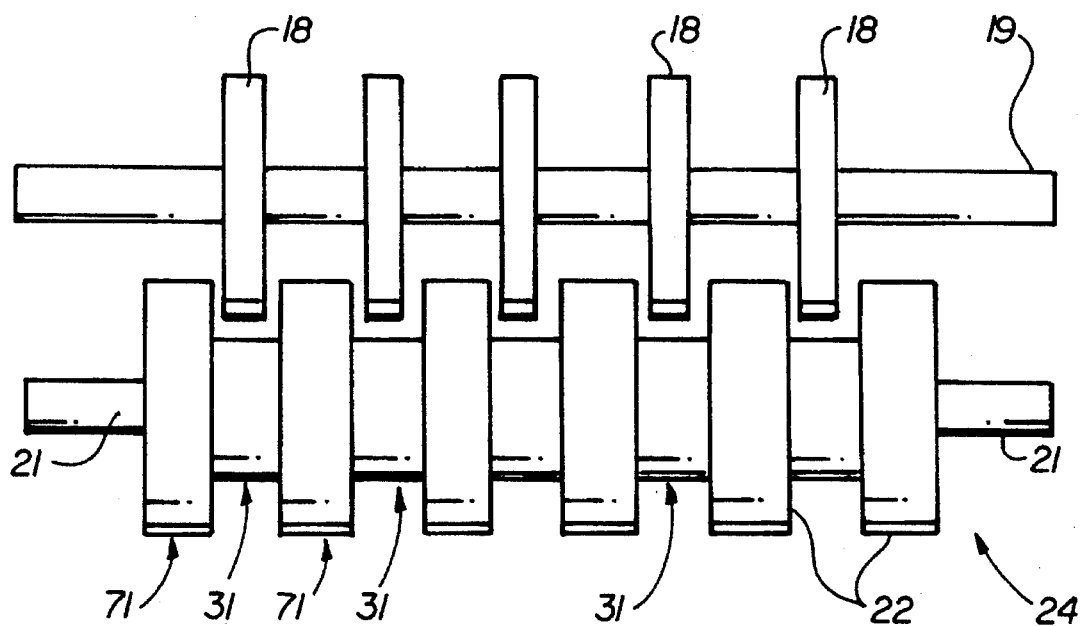
FIG. 6 is a bottom view illustrating the interfitting or interleaving of conveyor disks with the lower input roller assembly; and, FIG. 7 is a side section view illustrating a seal assembly utilized in the practice of the invention.

FIG. 6 is a bottom view, taken from the point of view indicated by arrow U in FIG. 5, illustrating the interfitting or interleaving of disks 18 with the lower input roller assembly 24. Each disk 18 extends between a pair of sleeves 71. The interfitting or interleaving of disks 18 between sleeves 71 makes it difficult for a small thin piece of circuit board substrate to travel downwardly intermediate the lower input roller assembly 24 and disks 18. As shown in FIG. 1, disks 17 are interfit or interleaved with disks 18, disks 14 are interfit with the lower output roller assembly 26, and disks 15 are intercatenated with disks 14. If desired, disks 16 can be intercatenated with disks 15 and 17.

Figure 7:
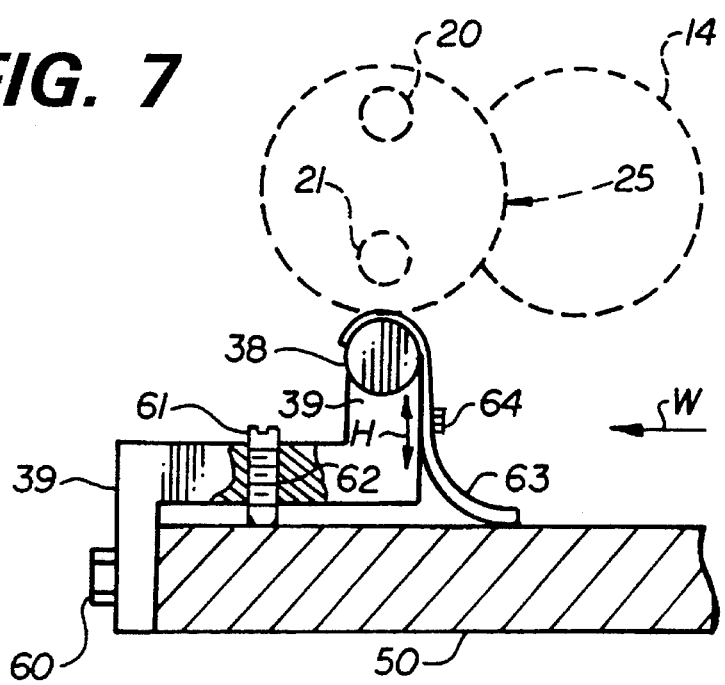

The seal assembly illustrated in FIGS. 2 and 7 minimizes the loss of fluid from reservoir 43 beneath the lower input and output roller assemblies. One seal assembly is utilized beneath the input roller assembly and another equivalent seal assembly is utilized beneath the output roller assembly. The seal assembly illustrated in FIG. 7 is beneath the lower output roller assembly 25 and includes an elongate cylindrical elastic rubber seal 38 which sealingly engages the bottom of assembly 25. Seal 38 is mounted in the upper end of support bracket 39. The lower end of bracket 39 is secured to bottom 50 with a plurality of bolts 60 which extend through bracket 39 into bottom 50. The elevation and the pressure of seal 38 against assembly 25 is adjusted in the directions of arrow H by turning externally threaded set screw 61 into and out of internally threaded aperture 62 against bottom 50. Rubber seal 63 is equal in length to seal 38 and is attached to bracket 39 with fasteners 64. Seal 63 helps prevent fluid from escaping from the reservoir 43 in the direction of arrow W. The seal assembly of FIG. 7 and the lower input and output roller assemblies 24 and 25 together function to reduce fluid loss from the reservoir 43 through the input and out roller assemblies from three to four gallons per minute to about one and a half gallons per minute.

In use, shaft 20 is rotated in the direction of arrow C to rotate rollers 30 and sleeves 71 in the directions of arrow C and T, respectively, in FIG. 5. Substrate 82 is fed between the upper roller input assembly 36A and the lower roller input assembly 24 in the manner illustrated in FIG. 5. Substrate 82 upwardly displaces the cylindrical disks on shaft 37 in the direction of arrow K as illustrated in FIG. 5. Shaft 37 is not upwardly displaced. The cylindrical disks on shaft 37 which are not contacted by substrate 82 are not upwardly displaced in the direction of arrow K. While the size of substrate 82 can vary, the apparatus of the invention is particularly effective at processing small thin substrates on the order of 0.016 inches thick by two and a quarter inches wide by three and a quarter inches long. The substrate 82 moves through reservoir 43 over disks 18, 17, 16, 15, 14 in the direction of arrow A in FIG. 1 and then passes intermediate the lower output roller assembly 25 and the upper output roller assembly 35A. When substrate 82 passes intermediate the lower roller assembly 25 and upper roller assembly 35A, substrate upwardly displaces the cylindrical disks on shaft 37 of the upper output roller assembly in the direction of arrow K in a manner similar to that shown in FIG. 5 for the upper input roller assembly 36A.

Having described my invention in such terms as to enable those skilled in the art to practice and understand the invention, I claim:

1. Apparatus for processing a circuit board substrate by passing the substrate through a reservoir, said apparatus including (a) upper input roller means;

(b) lower input roller means positioned below said upper input roller means;

(c) upper output roller means spaced apart from said upper input roller means and said lower input roller means;

(d) lower output roller means positioned below said upper output roller means and spaced apart from said upper input roller means and said lower input roller means;

(e) a liquid reservoir intermediate and extending above said lower input roller means and said lower output roller means, said substrate passing intermediate said upper and lower input roller means to enter said reservoir and passing intermediate said upper and lower output roller means to exit said reservoir;

(f) intermediate roller means adjacent said lower input roller means and including a plurality of spaced apart disks for contacting and supporting said substrate passing through said liquid reservoir from said lower input roller means to said lower output roller means;

said lower input roller means including (g) a plurality of spaced apart cylindrical members for contacting said substrate passing intermediate said upper and lower input roller means, each of said cylindrical members having an outer cylindrical surface having an equivalent diameter, a portion of said outer surface of each of said cylindrical members being coincident with a common contact line perpendicular to the direction of travel of the substrate between said upper input roller means and said lower input roller means, said cylindrical members contacting said substrate along said contact line; and, (h) a plurality of cylindrical rollers (31) each spaced apart from said contact line and mounted intermediate a pair of said cylindrical members such that at least a portion of one of said disks extends intermediate said pair of cylindrical members to facilitate the travel of said substrate from said cylindrical members onto said disk, each of said cylindrical rollers having an outer cylindrical surface having an equivalent diameter less than said diameter of said cylindrical members.

2. Apparatus for processing a circuit board substrate by passing the substrate through a reservoir, said apparatus including (a) upper input roller means;

(b) lower input roller means positioned below said upper input roller means;

(c) upper output roller means spaced apart from said upper input roller means and said lower input roller means;

(d) lower output roller means positioned below said upper output roller means and spaced apart from said upper input roller means and said lower input roller means;

(e) a liquid reservoir intermediate and extending above said lower input roller means and said lower output roller means, said substrate passing intermediate said upper and lower input roller means to enter said reservoir and passing intermediate said upper and lower output roller means to exit said reservoir;

(f) intermediate roller means adjacent said lower input roller means and including a plurality of spaced apart disks for contacting and supporting said substrate passing through said liquid reservoir from said lower input roller means to said lower output roller means;

said lower input roller means including (g) a plurality of spaced apart cylindrical members mounted on a first shaft for contacting said substrate passing intermediate said upper and lower input roller means, each of said cylindrical members having an outer cylindrical surface having an equivalent diameter, said shaft having a longitudinal axis;

(h) a plurality of cylindrical rollers each mounted on a second shaft intermediate a pair of said cylindrical numbers, said second shaft having a longitudinal axis parallel to the longitudinal axis of said first shaft, each of said rollers having an outer cylindrical surface having an equivalent diameter less than the diameter of said cylindrical members, a portion of said outer surface of each of said cylindrical members and a portion of said outer surface of each of said cylindrical rollers being coincident with a common line perpendicular to the direction of travel of the substrate between said upper input roller means and said lower input roller means; and, (i) means for rotating said cylindrical members and said cylindrical rollers.

3. Apparatus for processing a circuit board substrate by passing the substrate through a reservoir, said apparatus including (a) upper input roller means;

(b) lower input roller means positioned below said upper input roller means;

(c) upper output roller means spaced apart from said upper input roller means and said lower input roller means;

(d) lower output roller means positioned below said upper output roller means and spaced apart from said upper input roller means and said lower input roller means;

(e) a liquid reservoir intermediate and extending above said lower input roller means and said lower output roller means, said substrate passing intermediate said upper and lower input roller means to enter said reservoir and passing intermediate said upper and lower output roller means to exit said reservoir;

(f) intermediate roller means adjacent said lower input roller means and including a plurality of spaced apart disks for contacting and supporting said substrate passing through said liquid reservoir from said lower input roller means to said lower output roller means;

said lower input roller means including (g) a plurality of spaced apart fixed cylindrical members;

(h) a plurality of outer cylindrical sleeves (71) each having an outer cylindrical surface of equivalent diameter for contacting said substrate passing intermediate said upper and lower input roller means, each of said sleeves being operably associated with and slidably rotatably mounted on one of said cylindrical members, a portion of said outer surface of each of said cylindrical sleeves being coincident with a common contact line perpendicular to the direction of travel of the substrate between said upper input roller means and said lower input roller means, said cylindrical sleeves contacting said substrate along said contact line; and, (i) a plurality of cylindrical rollers each mounted intermediate a pair of said cylindrical members such that at least a portion of one of said disks extends intermediate said pair of cylindrical members to facilitate the travel of said substrate from said cylindrical members onto said disk.

4. The apparatus of claim 3 wherein said cylindrical rollers (30) each contact at least one of said sleeves (71).

5. The apparatus of claim 4 including means for rotating said cylindrical rollers such that each of said rollers frictionally contacts at least one of said sleeves and causes said one of said sleeves to rotate on the one of said cylindrical members operably associated with said one of said sleeves.

* * * * *